(12) United States Patent
Park et al.

(10) Patent No.: US 8,324,498 B2
(45) Date of Patent: *Dec. 4, 2012

(54) METHOD OF FORMING CRYSTALLINE LAYER, AND THIN FILM SOLAR CELL AND METHOD OF FABRICATING THE SOLAR CELL ADOPTING THE METHOD OF FORMING CRYSTALLINE LAYER

(75) Inventors: Youngjun Park, Suwon-si (KR); Junhee Choi, Seongnam-si (KR); Junggyu Nam, Suwon-si (KR)

(73) Assignees: Samsung SDI Co., Ltd., Yongin-si (KR); Samsung Electronics Co., Ltd., Suwon-si (KR)

( * ) Notice: Subject to any disclaimer, the term of this patent is extended or adjusted under 35 U.S.C. 154(b) by 475 days.

This patent is subject to a terminal disclaimer.

(21) Appl. No.: 12/270,588

(22) Filed: Nov. 13, 2008

(65) Prior Publication Data
US 2009/0223557 A1 Sep. 10, 2009

(30) Foreign Application Priority Data
Mar. 5, 2008 (KR) .................. 10-2008-0020584

(51) Int. Cl.
*H01L 31/00* (2006.01)
(52) U.S. Cl. ......... 136/256; 136/258; 136/261; 136/262
(58) Field of Classification Search ........... 136/243–293
See application file for complete search history.

(56) References Cited

U.S. PATENT DOCUMENTS

| 4,180,414 | A | * | 12/1979 | Diamond et al. | ............. | 136/246 |
| 4,254,429 | A | * | 3/1981 | Yamazaki | ....................... | 257/65 |
| 4,487,989 | A | * | 12/1984 | Wakefield et al. | ............. | 136/256 |
| 5,034,068 | A | | 7/1991 | Glenn et al. | | |
| 5,185,042 | A | * | 2/1993 | Ferguson | ...................... | 136/244 |
| 5,853,497 | A | | 12/1998 | Lillington et al. | | |
| 6,232,546 | B1 | * | 5/2001 | DiMatteo et al. | ............. | 136/253 |
| 6,896,780 | B2 | | 5/2005 | Yang et al. | | |
| 7,217,882 | B2 | | 5/2007 | Walukiewicz et al. | | |
| 7,329,361 | B2 | | 2/2008 | Guha et al. | | |
| 2003/0075213 | A1 | | 4/2003 | Chen | | |
| 2004/0166681 | A1 | * | 8/2004 | Iles et al. | ...................... | 438/689 |
| 2008/0245400 | A1 | | 10/2008 | Li | | |
| 2009/0020760 | A1 | | 1/2009 | Choi et al. | | |

(Continued)

FOREIGN PATENT DOCUMENTS

JP   6-204142   7/1994

(Continued)

OTHER PUBLICATIONS

U.S. Office action dated Jul. 20, 2011, for cross-reference U.S. Appl. No. 12/320,924, 11 pages.

(Continued)

*Primary Examiner* — Basia Ridley
*Assistant Examiner* — Thanh-Truc Trinh
(74) *Attorney, Agent, or Firm* — Christie, Parker & Hale, LLP

(57) ABSTRACT

A method of forming a crystalline layer includes: disposing a heating layer on a substrate, wherein the heating layer is separated from the substrate by a support structure; and forming a crystalline layer on the heating layer using heat generated from the heating layer.

9 Claims, 15 Drawing Sheets

U.S. PATENT DOCUMENTS

| | | | |
|---|---|---|---|
| 2009/0223557 A1 | 9/2009 | Park et al. |
| 2009/0250112 A1 | 10/2009 | Choi et al. |
| 2010/0187662 A1 | 7/2010 | Choi et al. |
| 2010/0302337 A1 | 12/2010 | Zhou et al. |

FOREIGN PATENT DOCUMENTS

| | | |
|---|---|---|
| JP | 7-106611 | 4/1995 |
| JP | 2001-068422 | 6/1999 |
| JP | 11-150283 | 3/2001 |

OTHER PUBLICATIONS

U.S. Office action dated Dec. 21, 2010, for cross-reference U.S. Appl. No. 12/232,711, 7 pages.

U.S. Notice of Allowance dated Jul. 7, 2011, for cross-reference U.S. Appl. No. 12/232,711, 9 pages.

U.S. Office action dated Sep. 21, 2011, for cross-reference U.S. Appl. No. 12/458,665, 11 pages.

\* cited by examiner

METHOD OF FORMING CRYSTALLINE LAYER, AND THIN FILM SOLAR CELL AND METHOD OF FABRICATING THE SOLAR CELL ADOPTING THE METHOD OF FORMING CRYSTALLINE LAYER

This application claims priority to Korean Patent Application No. 10-2008-0020584, filed on Mar. 5, 2008, and all the benefits accruing therefrom under 35 U.S.C. §119, the contents of which in its entirety are incorporated herein by reference.

BACKGROUND

1. Field

This disclosure relates to a thin film solar cell, and a method of fabricating the thin film solar cell.

2. Description of the Related Art

For commercialization of thin film solar cells, a method to improve fabrication efficiency of thin film solar cells, and reduce fabrication costs, is desirable. For commercial processes, polycrystalline silicon is preferred. The temperature of a thermal process is restricted by the thermal stability of any substrate materials. If the substrate comprises a material that has low thermal stability, for example, glass or plastic, the substrate cannot be thermally processed at an ultra-high temperature. Consequently, when a substrate of low thermal stability is used, crystallization of silicon is performed at a temperature that the substrate can sustain without substantial degradation, and as a result polycrystalline silicon of satisfactory quality cannot be obtained. In addition, even when a thermal process is performed at a temperature that the substrate can sustain without degradation, the substrate still can be exposed to a locally high temperature, and thus the substrate may be damaged or may deform.

In electronic devices other than thin film solar cells, in which a crystalline material layer obtained from an amorphous material is used as an active layer, the temperature for crystallizing the amorphous material is selected by the thermal process temperature, which is restricted by the thermal stability of the substrate that supports structural materials of the electronic device. Accordingly, limits on process temperatures limit improvements in the quality of a crystalline thin film.

SUMMARY

Exemplary embodiments relate to a method of crystallizing an amorphous layer, by which a high quality crystalline thin film can be obtained.

Exemplary embodiments also relate to a high efficiency thin film solar cell, which is easily fabricated with low fabrication costs using an efficient crystallization of an amorphous layer, and a method of fabricating the thin film solar cell.

The above described and other drawbacks are alleviated by a method of forming a crystalline layer, the method includes: disposing a heating layer on a substrate, wherein the heating layer is separated from the substrate by a support structure; and forming a crystalline layer on the heating layer using heat generated from the heating layer.

Disclosed herein too is a method of fabricating a thin film solar cell, the method including: disposing a first electrode for generating heat on a substrate, the first electrode being separated from the substrate by a support structure; disposing a first semiconductor layer on the first electrode, the first semiconductor layer comprising of an amorphous material; generating heat from the first electrode by applying a voltage to the first electrode; and crystallizing the first semiconductor layer by thermally processing the first semiconductor layer using the heat generated from the first electrode.

The method may further include: forming a second semiconductor layer using a semiconductor material that is of a different type from that of the first semiconductor layer, between the forming of the first semiconductor layer and the generating of heat.

The method may further include: forming a second semiconductor layer that is of a different type from that of the first semiconductor layer, after crystallizing the first semiconductor layer.

The method may further include: forming an intrinsic semiconductor layer on the first semiconductor layer; and forming a second semiconductor layer that is of a different type from that of the first semiconductor layer on the intrinsic semiconductor layer, after crystallizing the first semiconductor layer.

The first and second semiconductor layers and the intrinsic semiconductor layer may be silicon semiconductor layers.

The first semiconductor layer may be n-semiconductor layer, and the second semiconductor layer may be p-semiconductor layer.

According to another aspect, there is provided a thin film solar cell including: a substrate; a first electrode for electrically generating heat; a support structure supporting the first electrode so that the first electrode can be separated from the substrate; a photoelectric conversion layer disposed on the first electrode; and a second electrode disposed on the photoelectric conversion layer.

The suspending structure may include suspending pillars formed on the substrate.

The first electrode may be formed as a strip extending in a direction. A plurality of first electrodes that are formed as bands may be disposed as stripes in parallel with each other. The photoelectric conversion layer corresponding to the first electrode and the second electrode may be formed on the first electrode formed as the strip.

The first electrode may include support plates extending in a direction crossing the first electrode, and the suspending structure may include a plurality of support pillars respectively supporting the support plates.

The photoelectric conversion layer may have a PN junction structure or a PIN junction structure.

BRIEF DESCRIPTION OF THE DRAWINGS

The above and other features and advantages the disclosed embodiments will become more apparent by describing in detail exemplary embodiments thereof with reference to the accompanying drawings, in which.

DETAILED DESCRIPTION OF EMBODIMENTS

Figure 1A:
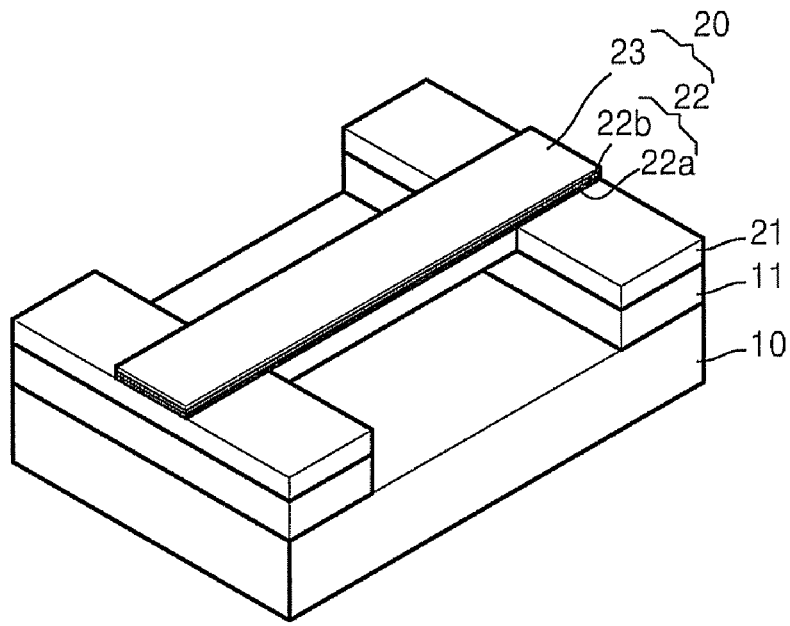
FIG. 1A is a perspective view showing a schematic structure of a thin film solar cell according to an exemplary embodiment.

Described more fully hereinafter, with reference to the accompanying drawings, are embodiments of the disclosure. The disclosed embodiments should not be construed as limiting the claims to the exemplary embodiments shown. Rather, these embodiments are provided to convey the scope of the disclosure to one skilled in the art. In the drawings, the size and relative sizes of elements and regions may be exaggerated for clarity.

It will be understood that when an element or layer is referred to as being "on", "disposed on", "disposed", or "between" another element or layer, it can be directly on, disposed on, disposed, or between the other element or layer, or intervening elements or layers can be present.

The terms "first," "second," and the like, "primary," "secondary," and the like, as used herein do not denote any order, quantity, or importance, but rather are used to distinguish one element, region, component, layer, or section from another. The terms "front", "back", "bottom", and/or "top" are used herein, unless otherwise noted, merely for convenience of description, and are not limited to any one position or spatial orientation.

The terms "a" and "an" do not denote a limitation of quantity, but rather denote the presence of at least one of the referenced item. The suffix "(s)" as used herein is intended to include both the singular and the plural of the term that it modifies, thereby comprising one or more of that term (e.g., the layer(s) includes one or more layers).

Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various exemplary embodiments.

The endpoints of all ranges directed to the same component or property are inclusive of the endpoint and independently combinable, e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc. The modifier "about" used in connection with a quantity is inclusive of the stated value and has the meaning dictated by the context (e.g., includes the degree of error associated with measurement of the particular quantity).

Unless defined otherwise, the technical and scientific terms used herein have the same meaning as is commonly understood by one of skill in the art.

Figure 1B:
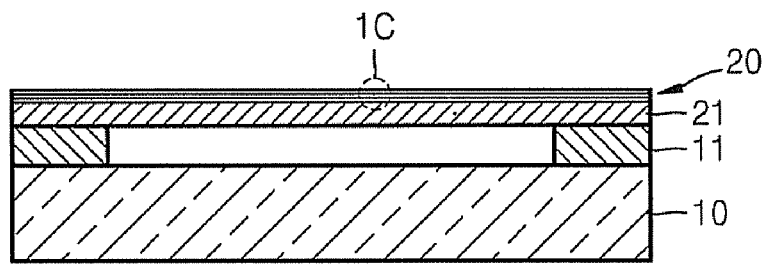
FIG. 1B is a cross-sectional view of the thin film solar cell shown in FIG. 1A.
Figure 1C:
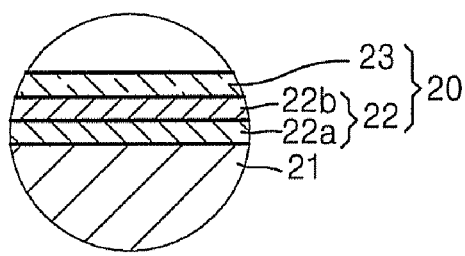
FIG. 1C is an expanded cross-sectional view of a portion of the thin film solar cell of FIG. 1A.

FIG. 1A is a perspective view showing a schematic structure of a thin film solar cell according to an embodiment, FIG. 1B is a cross-sectional view of the thin film solar cell of FIG. 1A; and FIG. 1C is an expanded cross-sectional view of a portion of the thin film solar cell of FIG. 1A.

Referring to FIGS. 1A and 1B, a pair of support pillars 11, which are disposed as support structures, are disposed on a substrate 10 with a selected distance therebetween, so as to support both lower ends of a unit solar cell structure 20. The unit solar cell structure 20, the lower surface of the ends of which are disposed on the support pillars 11, includes a heating element 21 (hereinafter, also referred to as a first electrode, which functions as a lower electrode), a photoelectric conversion layer 22 disposed on the heating element 21, and an upper electrode 23 (hereinafter, also referred to as a second electrode) disposed on the photoelectric conversion layer 22. Both ends of the heating element 21 are disposed on the top surfaces of the support pillars 11.

The heating element 21 comprises W, Mo, SiC, or the like, or a combination comprising at least one of the foregoing materials, and functions as a lower electrode or a first electrode. The second electrode 23 comprises a transparent conductive material such as indium tin oxide (ITO) or a transparent conductive oxide (TCO). The photoelectric conversion layer 22, disposed between the heating element 21 and the second electrode 23, includes a first semiconductor layer 22a, which comprises an n-type or a p-type semiconductor material, and a second semiconductor layer 22b, which comprises a p-type or an n-type semiconductor material. In addition, according to an embodiment, the first and second semiconductor layers 22a and 22b can comprise silicon (Si), germanium (Ge), a III-V compound, a II-VI compound, or the like, or a combination comprising at least one of the foregoing materials. The disclosed embodiments are not limited to the materials forming the photoelectric conversion layer 22, or a stacked structure of the photoelectric conversion layer 22. In addition, descriptions of commercially available processes and elements for the fabrication of solar cells are omitted in the descriptions of the embodiments for clarity. Hereinafter, the silicon will be described as a representative semiconductor material. In an embodiment, the first semiconductor layer 22a, which is disposed on heating element 21, comprises a polycrystalline material, and the second semiconductor layer 22b, which is disposed on the first semiconductor layer 22a, can comprise an amorphous material or a polycrystalline material. In addition, according to another embodiment, an intrinsic semiconductor layer, for example, an intrinsic semiconductor silicon layer, can be disposed between the first semiconductor layer 22a and the second semiconductor layer 22b. When the intrinsic semiconductor layer is disposed between the first and second semiconductor layers 22a and 22b, the second semiconductor layer 22b can comprise an amorphous material.

Figure 2A:
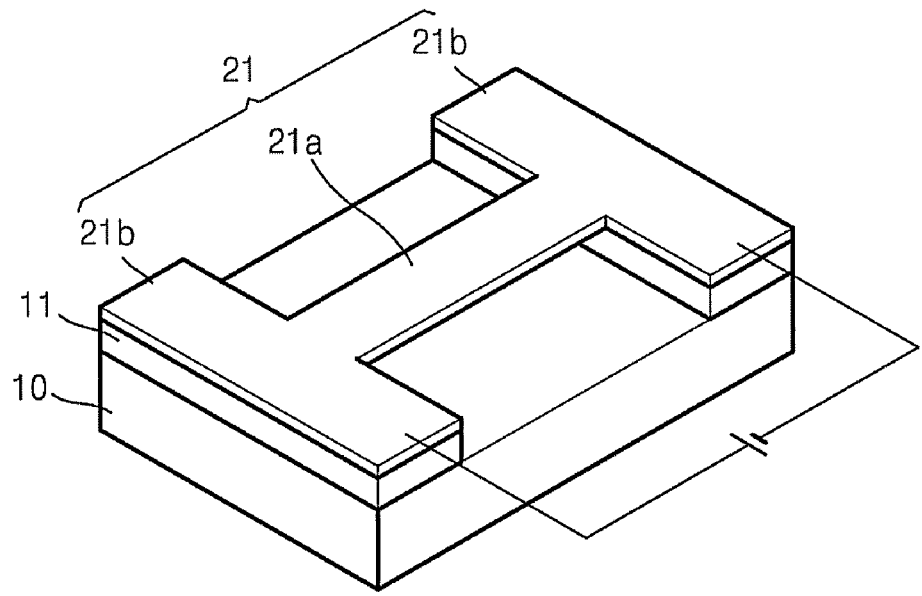
FIG. 2A is a perspective view showing a structure for applying a voltage to a heating element in a crystallization process of a first semiconductor layer, according to an exemplary embodiment.

FIG. 2A is a perspective view showing a structure for applying a voltage to heating element 21, which is shown in FIG. 1A, in the crystallization process of the first semiconductor layer 22a, according to another embodiment.

As is shown in FIG. 2A, heating element 21 includes a heating portion 21a, and terminals 21b on both ends of the heating portion 21a. The terminals 21b are disposed on the support pillars 11. In this configuration, when a voltage is applied through both of the terminals 21b, the heating portion 21a generates Joule heat. The Joule heat melts the first semiconductor layer 22a, which is disposed on the heating portion 21a in an amorphous state, and upon cooling the first semiconductor layer 22a is crystallized. In this process, initial crystal nuclei are formed near to the support pillars 11, where heat is absorbed by the substrate 10. After heating the heating element 21 by applying a voltage thereto, a crystalline layer may be grown on the heating element 21 directly using the heat generated from the heating element 21.

Figure 2B:
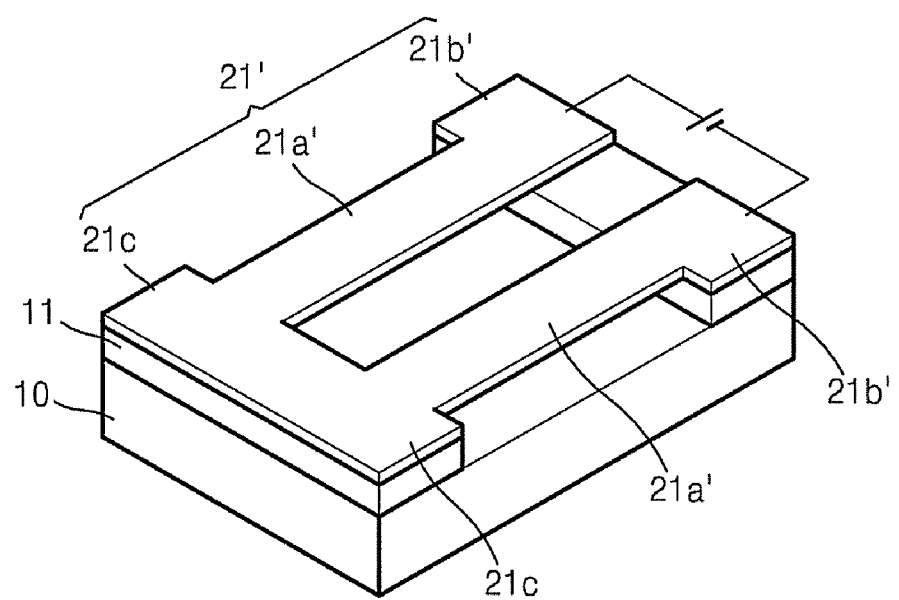
FIG. 2B is a perspective view showing a structure for applying a voltage to the heating element in a crystallization process, according to an exemplary embodiment.

FIG. 2B shows a heating element 21' according to another embodiment. The heating element 21' includes two unit heating portions 21a', which are substantially parallel with each other. End portions 21c of the unit heating portions 21a' are connected to each other and disposed on one of the support pillars 11, and the other end portions 21b' of the unit heating portions 21a' are separated from each other and disposed on another of the support pillars 11. In this configuration, when a voltage is applied to the end portions 21b', the unit heating portions 21a' generate heat that is absorbed through the support pillar 11 into the substrate 10.

Figure 3A:
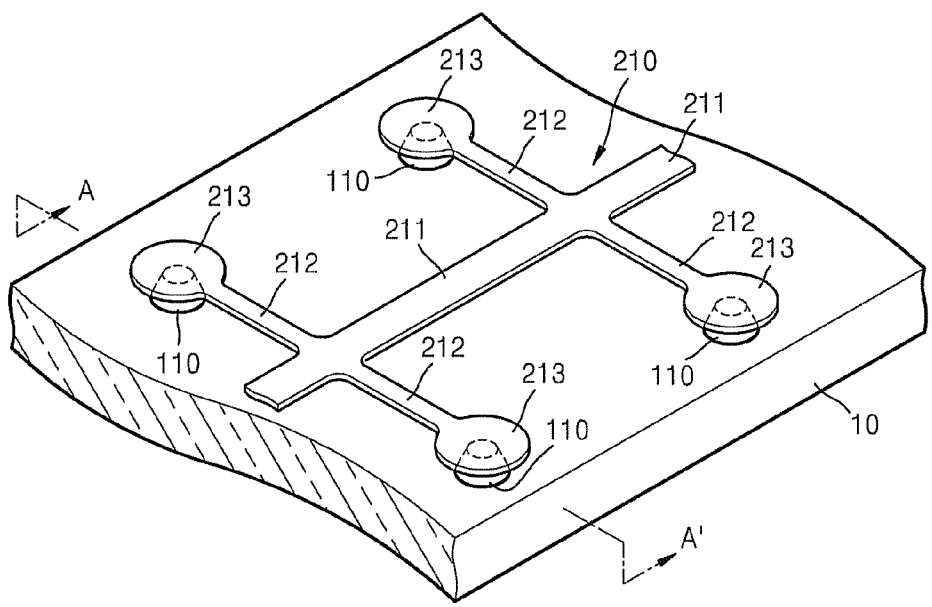
FIG. 3A is a perspective view of a portion of a heating element, according to an exemplary embodiment.
Figure 3B:
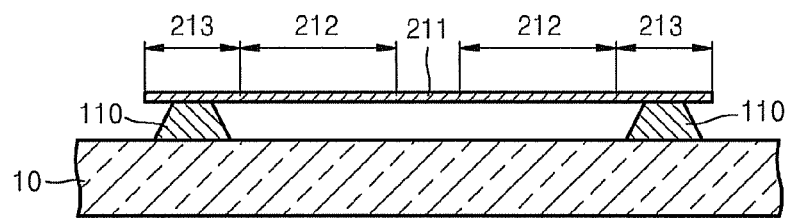
FIG. 3B is a cross-sectional view of the heating element shown in FIG. 3A, taken along line A-A'.

FIG. 3A is a perspective view of a portion of heating element 210 according to another embodiment, and FIG. 3B is a cross-sectional view of the heating element 210 shown in FIG. 3A, taken along line A-A' shown in FIG. 3A. In this embodiment, the heating element 210 has a support structure for preventing support pillars 110 from being thermally shocked or thermally damaged due to the heat generated from heating portions 211 of the heating element 210.

Figure 3C:
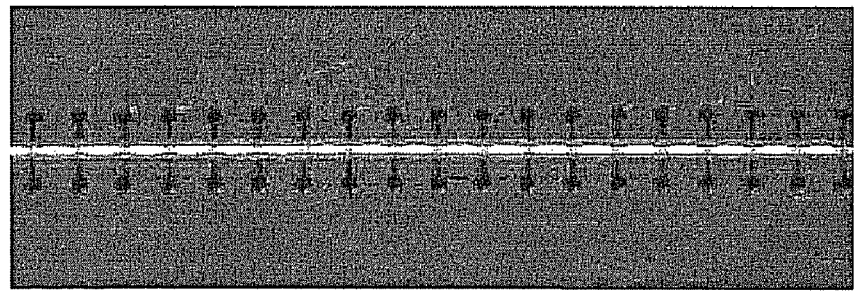
FIG. 3C is an optical photograph showing temperature distribution in the heating element shown in FIGS. 3A and 3B.

Referring to FIGS. 3A and 3B, the heating element 210 includes the heating portions 211 extending in a selected direction, and extensions 212 extending from both sides of the heating portions 211 in direction different from the direction of the heating portions 211. For example, the extensions 212 can extend from both sides of the heating portions 211 in a direction that is at a right angle to the direction in which the heating portions 211 extend, and support plates 213 can be disposed under end portions of the extensions 212. The support pillars 110, which can have a conical shape with a selected height and with a flat top surface, are disposed under each of the support plates 213. When a voltage is applied to both ends of the heating portions 211 of the heating element 210, the electric current flows only through the heating portions 211, and thus, Joule heat generates at the heating portions 211. In addition, some of the heat is transferred to and absorbed by the extensions 212 and the support plates 213, which extend from the heating portions 211. In this configuration, since the support pillars 110 are separated from the heating portions 211, where high temperatures are generated, the thermal shock applied to the support pillars 110 is greatly decreased. FIG. 3C is an optical photograph showing the heat distribution in the heating element 210 shown in FIGS. 3A and 3B. In the photograph, the heating portions 211 that are arranged in a straight line are bright, and the extensions 212 are dark. Therefore, it can be observed that some of the heat is absorbed by the extensions 212.

Figure 4A:
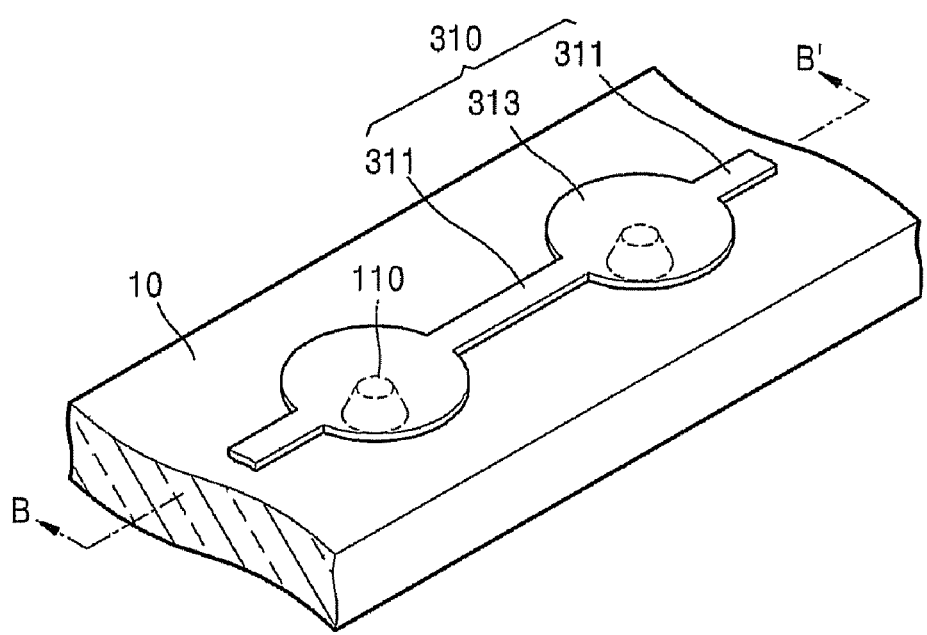
FIG. 4A is a perspective view of a portion of a heating element according to an exemplary embodiment.
Figure 4B:
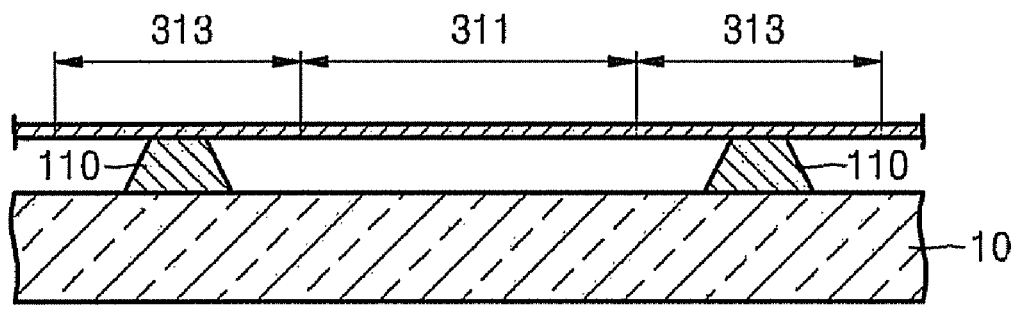
FIG. 4B is a cross-sectional view of the heating element shown in FIG. 4A, taken along line B-B'.
Figure 4C:
FIG. 4C is an optical photograph showing temperature distribution in the heating element shown in FIG. 4A.

FIG. 4A shows a perspective view of a portion of heating element 310, in which support plates 313 are disposed between heating portions 311, according to another embodiment, and FIG. 4B is a cross-sectional view of the heating element 310 of FIG. 4A, taken along line B-B'. The heating element 310 includes the heating portions 311 that have a high resistance and thin bar shapes, and support plates 313 that have a low resistance, disk shapes, and are configured between the heating portions 311. A plurality of support pillars 110, which comprise a cone having a flat top surface, are located under the support plates 313. FIG. 4C is an optical photograph showing the heat distribution in an exemplary embodiment of the heating element 310, as shown in FIGS. 4A and 4B. Referring to FIG. 4C, bright portions, the heating portions 311, are observed between the support plates 313, which are dark disks in FIG. 4C. The support plates 313 and the heating portions 311 are electrically arranged in a row, and the heating portions 311 have relatively high resistance, thus generate heat.

As described above, the heating element is used as a heat source in a process of poly-crystallizing an amorphous semiconductor material, such as for example, amorphous silicon, during the processes of fabricating the solar cell, and is used as the first electrode in the lower portion of a completed solar cell, the completed solar cell having a PN junction diode or a PIN junction diode. Since the first electrode, as the heat source, is separated from the substrate by a support structure, such as the support pillar, the thermal shock applied to the substrate from the heating element can be efficiently reduced. Therefore, the crystallization temperature, that is, the temperature established by the heat generated by the heating element, is not limited by the properties of the substrate material. Accordingly, using the above described heating element, the amorphous silicon can be melted at a temperature of 1000° C. or higher, and thus, a polycrystalline semiconductor layer of an excellent quality can be obtained.

Figure 5A:
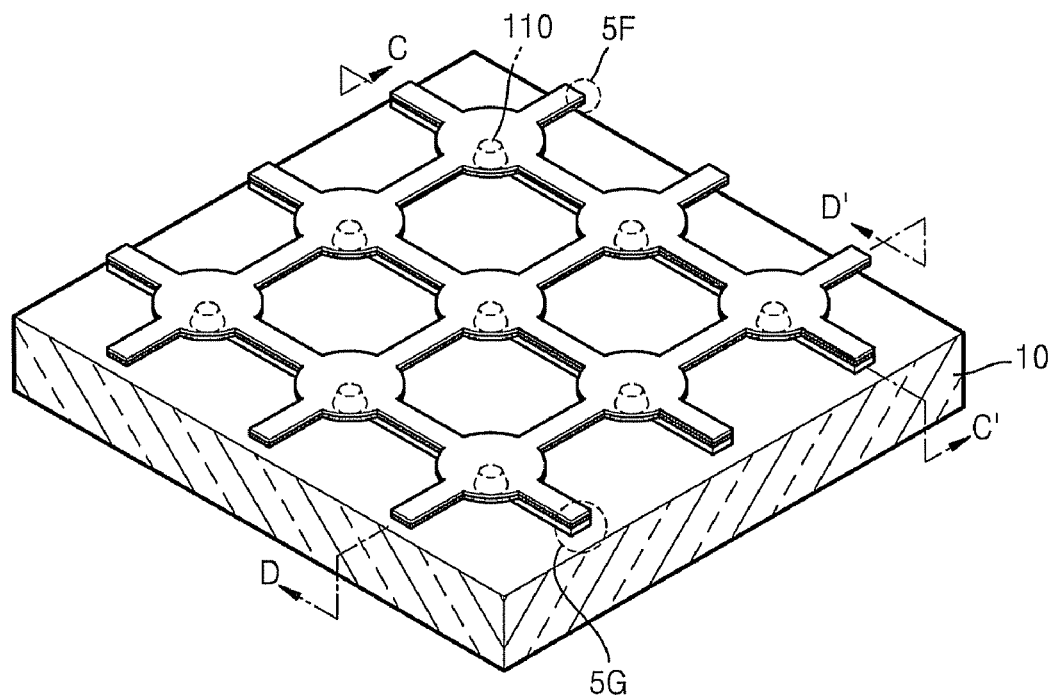
FIG. 5A is a perspective view of a solar cell according to another exemplary embodiment.
Figure 5B:
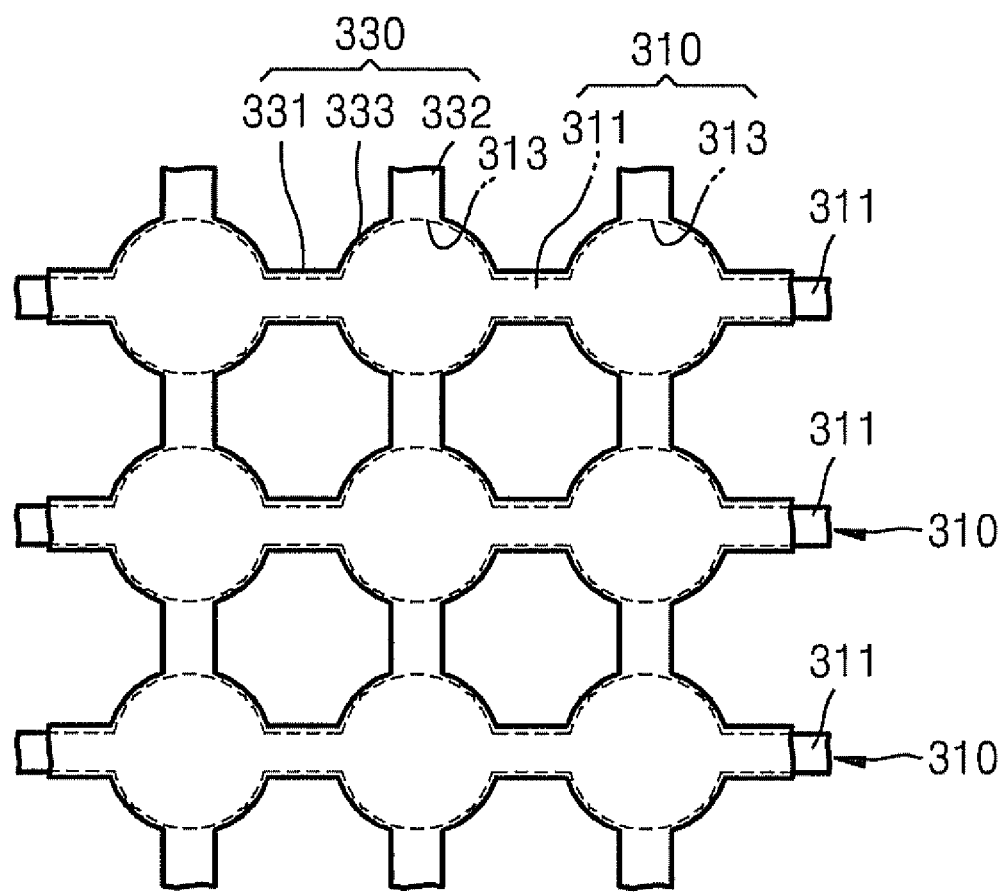
FIG. 5B is a diagram showing a layout of a plurality of the first electrodes shown in FIG. 4B and a plurality of the second electrodes in the solar cell shown in FIG. 5A.
Figure 5C:
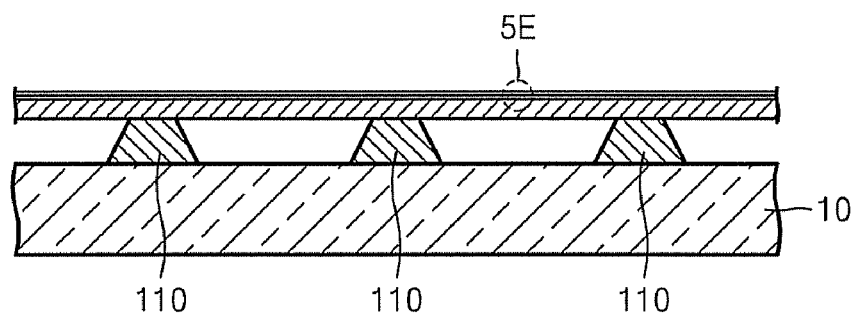
FIG. 5C is a cross-sectional view of the solar cell shown in FIG. 5A, taken along line C-C'.
Figure 5D:
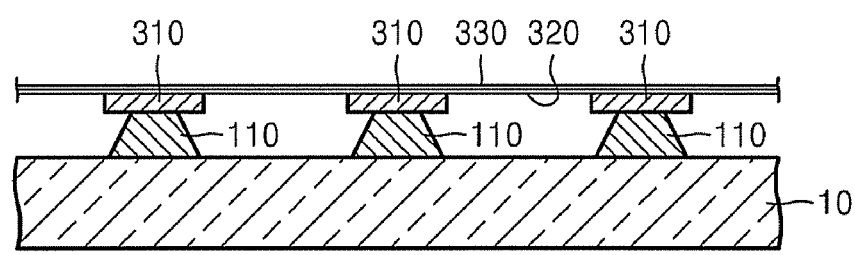
FIG. 5D is a cross-sectional view of the solar cell shown in FIG. 5A, taken along line D-D'.
Figure 5E:
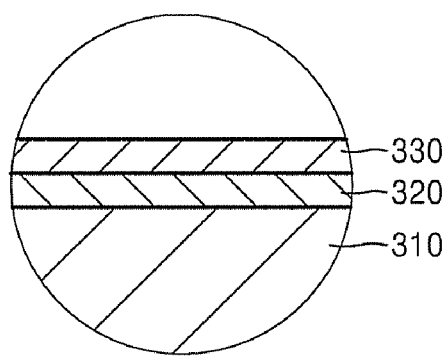
FIG. 5E is an expanded cross-sectional view of a portion of the solar cell shown in FIG. 5A, taken along line C-C'.
Figure 5F:
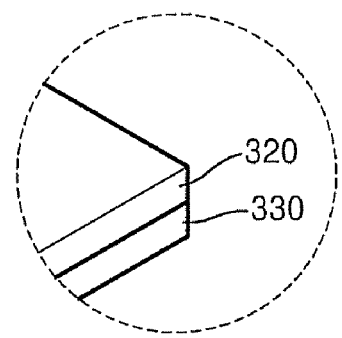
FIG. 5F is an expanded view of a portion of the solar cell of FIG. 5A.
Figure 5G:
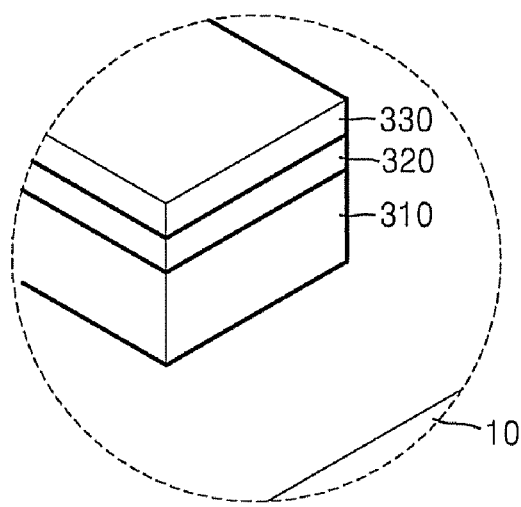
FIG. 5G is an expanded view of a portion of the solar cell of FIG. 5A.

FIG. 5A is a schematic perspective view of a solar cell using a plurality of the heating elements 310 as the first electrodes in a lower portion of a solar cell. FIG. 5B schematically shows a layout of the first electrode 310 in the lower portion of the solar cell, and a second electrode 330 in an upper portion of the solar cell. Shown FIGS. 5C and 5D are cross-sectional views showing the solar cell of FIG. 5A, taken along lines C-C' and D-D', respectively. In addition, shown in FIG. 5E is an expanded cross-sectional view of a portion of the solar cell of FIG. 5A. FIG. 5F and FIG. 5G also show expanded views of portions of the solar cell depicted in FIG. 5A as is indicated in FIG. 5A.

Referring to FIGS. 5A and 5B, the plurality of first electrodes 310, each of which comprises the first electrode shown in FIG. 4A, are arranged in a striped configuration so as to be substantially parallel with each other. In addition, the plurality of second electrodes 330 comprise a grating-like structure, which includes disk portions 333 corresponding to the support plates 313 of the first electrodes 310, and connecting portions 331 and 332 in four directions around the disk portions 333 to connect the disk portions 333 to each other, and the connecting portions 331, which correspond to the heating portions 311 of the first electrodes 310. A photoelectric conversion layer 320, having a PN or a PIN junction structure, is located between the overlapping portions of the first electrodes 310 and the second electrodes 330.

In more detail, FIG. 5C shows a stacked structure of the solar cell in a first direction, that is, a length direction. FIG. 5E shows an expanded view of a portion of the stacked structure of the solar cell shown in FIG. 5C, which has a sandwich-type structure, including the first electrodes 310, the photoelectric conversion layer 320, and the second electrodes 330. As is shown in FIG. 5C, the sandwich-type structure is supported by the support pillars 110 of the first electrodes 310 so that the support pillars 110 are located under the sandwich-type structure. In addition, referring to FIG. 5D, which shows the stacked structure in a second direction that is at a right angle to the first direction, the sandwich-type structure includes the first electrodes 310, the photoelectric conversion layer 320, and the second electrodes 330, and is located on the support pillars 110 of the first electrodes 310. Here, the first electrodes 310 are located only on upper portions of the support pillars 110, and thus, a bottom surface of the photoelectric conversion layer 320 is exposed in portions of the photoelectric conversion layer 320, which are between the support pillars 110. The above-described structure is a solar cell with a large capacity and a large area, wherein unit solar cells can be arranged in arrays.

Hereinafter, a method of fabricating a solar cell according to an embodiment will be described with reference to accompanying drawings.

FIGS. 6A through 6E illustrate a process of fabricating a solar cell having a first electrode, such as first electrode 21, which is shown in FIG. 2A, according to an embodiment.

Figure 6A:
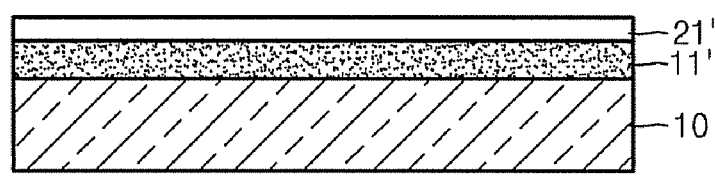
FIGS. 6A through 6E are diagrams illustrating a process for fabricating a thin film solar cell having the first electrode as shown in FIG. 2A, according to an exemplary embodiment.

Referring to FIG. 6A, a sacrificial layer 11' and a heating material layer 21', which comprise a heating material, are disposed on the substrate 10. The sacrificial layer 11' comprises, for example, $SiO_2$, and can be disposed using a chemical vapor deposition (CVD) method, for example. The heating material layer 21' comprises a material such as W, Mo, SiC, or the like, or a combination comprising at least one of the foregoing materials, for example, and can be disposed using a physical vapor deposition (PVD) method, such as by sputtering, electron beam deposition, or the like, for example.

Figure 6B:
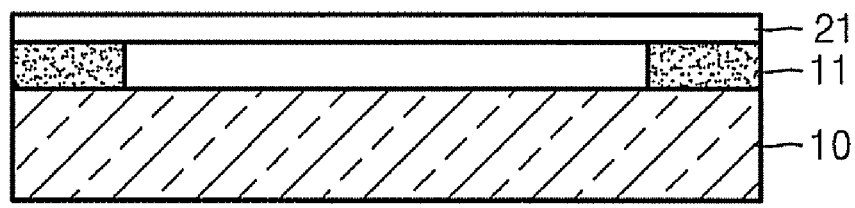

As shown in FIG. 6B, the heating material layer 21' and the sacrificial layer 11' are patterned to obtain the heating element 21 shown in FIG. 2A, and support pillars 11, which support the heating element 21. To do this, the heating material layer 21' is patterned to obtain the heating element 21, and then, the sacrificial layer 11' under the heating element 21 is wet-etched using the heating element 21 as a mask to obtain the support pillars 11 from the remaining portions of the etched pattern.

Figure 6C:
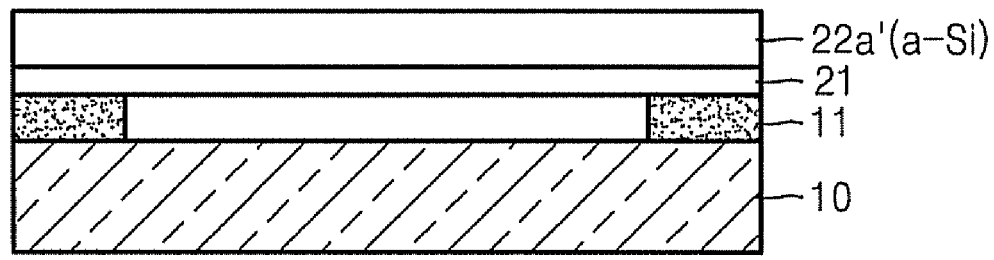

Referring to FIG. 6C, an amorphous semiconductor material, for example, amorphous silicon (a-Si) 22a', is disposed on the first electrode 21 using CVD. Here, an amorphous silicon layer is also disposed on a surface of the substrate 10 and on the heating element 21.

Figure 6D:
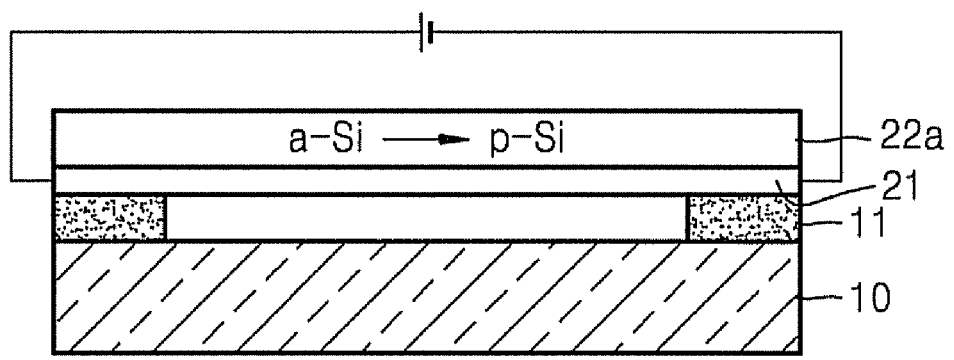

Referring to FIG. 6D, a voltage is applied to the heating element 21 for a selected time to generate Joule heat and to melt the a-Si 22a' on the heating element 21. The melted a-Si 22a' starts to solidify when the heating element 21 stops generating heat, and then, a crystallization of the a-Si 22a' occurs. Thus, crystal nuclei form around the support pillars 11, which absorb heat, and thus, a crystal growth proceeds toward a center portion of the heating element 21 in a direction parallel to the heating element 21. After that, a polycrystalline semiconductor layer, for example, a first semiconductor layer 22a formed of polycrystalline silicon can be obtained. A coalescence boundary, on which the crystals growing from both ends of the heating element 21 are combined, can exist at the center portion of the heating element 21.

Figure 6E:
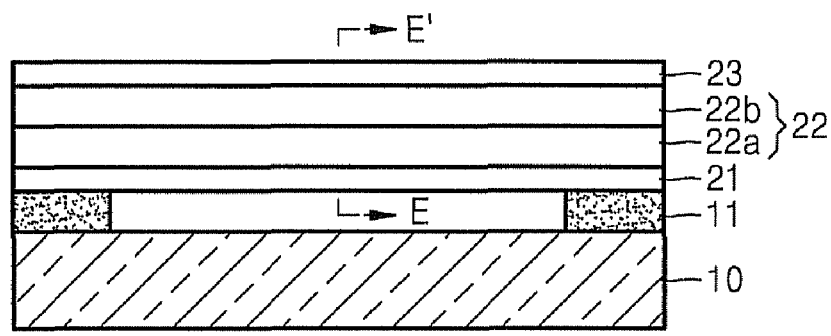

Referring to FIG. 6E, a material that is different from that of the first semiconductor layer 22a, for example, p-type silicon, is disposed to form a second semiconductor layer 22b, and a transparent conductive material, for example, an ITO layer, is disposed on the second semiconductor layer 22b to form a second electrode 23. Then, the fabrication of the desired solar cell is completed. Here, the material for the second semiconductor layer 22b, and the material for the second electrode 23, can be disposed on the substrate 10, however, the materials disposed directly on the substrate are electrically separated from the first and second electrodes 21 and 23 and may have no function in the solar cell.

According to an embodiment, the first electrode is used as the heat source for poly-crystallizing the semiconductor layer on the first electrode in the solar cell. The polycrystalline semiconductor, for example, polycrystalline silicon, polycrystalline germanium, or the like, or a combination comprising at least one of the foregoing materials, can be fabricated by local heat generation by the first electrode. Accordingly, the polycrystalline semiconductor layer can be obtained without using an additional thermal processing apparatus or performing an additional process. When the crystallization process is performed using a first electrode having a narrow configuration, which generates heat, the substrate is separated from the first electrode by the support structure, for example, the support pillars, and thus, the temperature of the substrate can be maintained at about room temperature. Therefore, a polycrystalline semiconductor layer can be processed at a high temperature and can be disposed on a glass or plastic substrate. Accordingly, the fabrication costs of the solar cell can be reduced, and the solar cell of an excellent quality may be obtained. The heating element or the first electrodes according to the embodiments may be formed in various shapes, for example, a plate shape, a core-shell, a band-like shape, a rod-like shape, a wire-like shape, or a thread shape.

In the above-described process, the second semiconductor layer 22b is disposed after performing the process shown in FIG. 6D. However, according to another embodiment, an n-type or a p-type semiconductor material layer and a p-type or an n-type first semiconductor material are sequentially disposed, and after that, the poly-crystallization process shown in FIG. 6D may be performed. According to this embodiment, the first semiconductor layer 22a and the second semiconductor layer 22b are thermally treated together. Therefore, in a case where a sufficient amount of heat is supplied to the first and second semiconductor layers 22a and 22b, both of the first and second semiconductor layers 22a and 22b may have a polycrystalline structure. If the heat is not sufficiently supplied to the second semiconductor layer 22b, the polycrystalline silicon and the amorphous silicon may mix in the second semiconductor layer 22b, or the second semiconductor layer 22b may have a micro-crystalline structure comprising small size crystals. On the other hand, after performing the process of FIG. 6D, an intrinsic semiconductor material layer may be disposed before disposing the second semiconductor layer 22b. Then, a solar cell having a PIN junction structure can be obtained by disposing the intrinsic semiconductor material layer.

Figure 7A:
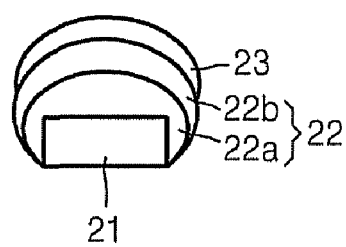
FIG. 7A is a longitudinal cross-sectional view of the solar cell shown in FIG. 6E, taken along line E-E'.
Figure 7B:
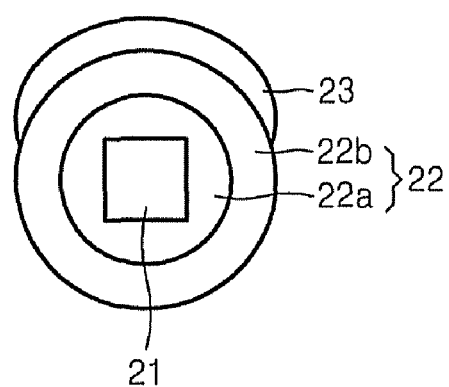
FIG. 7B is a longitudinal cross-sectional view of a solar cell according to another exemplary embodiment.

When a photoelectric conversion layer is disposed on the heating element 21 using the above-described processes, however, the stacked structure may vary. FIG. 7A is a longitudinal cross-sectional view of the photoelectric conversion layer of FIG. 6E, taken along line E-E'. The edges of the stacked layers are not aligned with each other, and the surfaces of the stacked layers are rounded so that the entire surface of the stacked structure can be curved. In particular, the first and second semiconductor layers 22a and 22b, disposed using CVD, are not only disposed on the top surface of the heating element 21, but may be disposed on a side surface of the heating element 21, to which a gas contacts. As shown in FIG. 7B, if a thickness and a width of the heating element 21 are similar to each other, a source gas may contact all surfaces of the heating element 21 in the CVD process, and thus, the first and second semiconductor layers 22a and 22b may be disposed so as to completely surround the heating element 21. The stacked structure on the heating element 21 may vary according to process conditions, and that disclosed is not limited to the stacked structure shown.

Hereinafter, a method of fabricating the solar cell shown in FIGS. 5A and 5B will be described. Thus, processes for fabricating the solar cell shown in FIGS. 4A and 4B will be understood from the following descriptions.

FIGS. 8A through 8G illustrate a method of fabricating a solar cell having the first electrode 310 shown in FIGS. 4A and 5A, according to another embodiment.

Figure 8A:
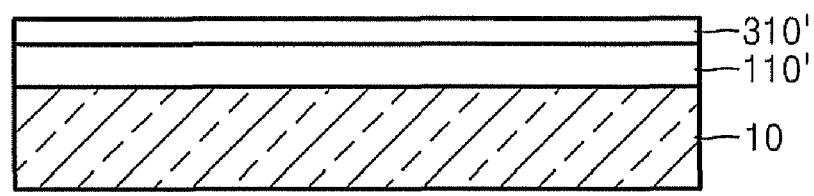
FIGS. 8A through 8G are diagrams illustrating a method of fabricating a thin film solar cell having the first electrode 310 as shown in FIGS. 4A and 5A, according to another exemplary embodiment.

Referring to FIG. 8A, a sacrificial layer 110' and a heating material layer 310' are disposed on a substrate 10. The sacrificial layer 110' comprises, for example, $SiO_2$, and can be disposed using by CVD. The heating material layer 310' comprises a material such as W, Mo, or SiC, and can be disposed using PVD, for example, thus by sputtering or electron beam deposition, for example.

Figure 8B:
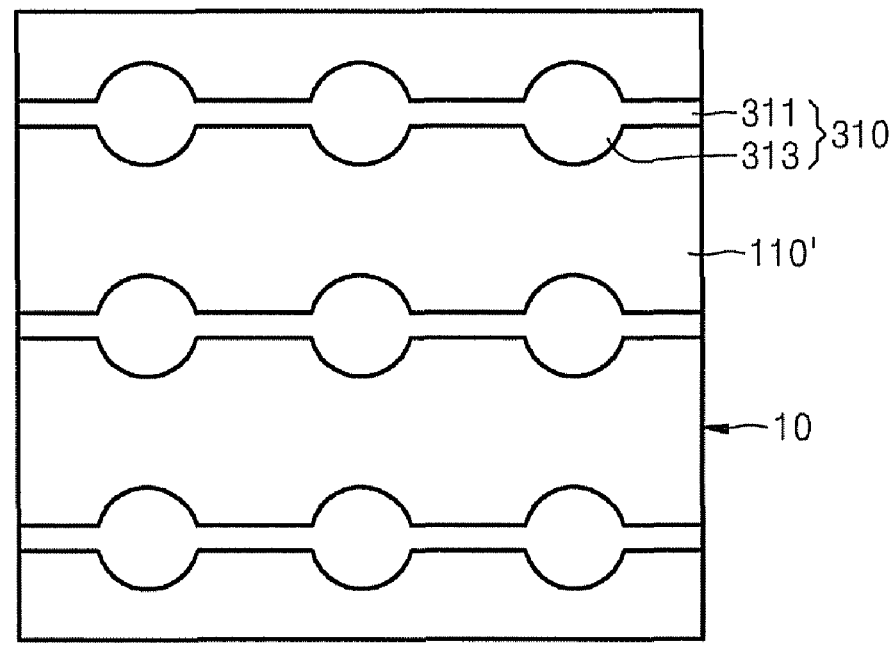

Referring to FIG. 8B, the heating material layer 310' is patterned using a dry-etching method using a mask, to form a plurality of heating elements 310. Each heating element 310 includes heating portions 311 and support plates 313, the support plates having a disk shape, and are configured between the heating portions 311, in a substantially parallel configuration. Here, each of the heating portions 311 between the support plates 313 correspond to a unit solar cell.

Figure 8C:
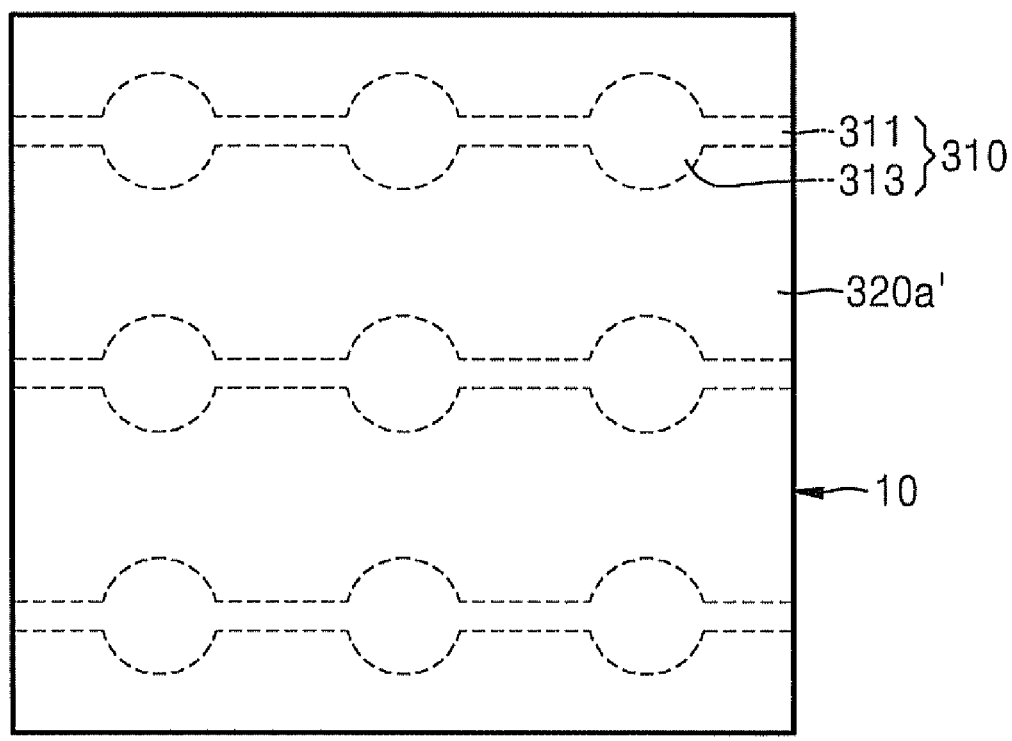

Referring to FIG. 8C, an amorphous silicon layer 320a', which is a n-type or a p-type semiconductor layer, covers the heating element 310, and the sacrificial layer 110' is disposed using CVD.

Figure 8D:
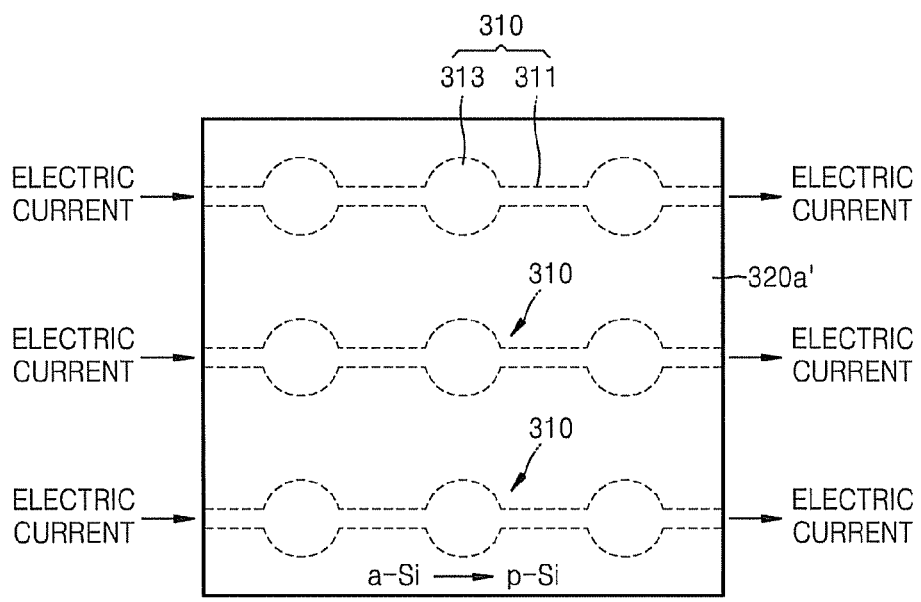

Referring to FIG. 8D, electric current is supplied to each of the heating elements 310 so as to melt the a-Si, that is, the first semiconductor material, on the heating element 310, and after that, the melted semiconductor material crystallizes to form the polycrystalline silicon. Through this crystallization process, the polycrystalline silicon may be formed on the heating portions 311, which have a high resistance value, and the a-Si may remain on the other portions of the heating elements 310, where the first electrodes 311 are not formed.

Figure 8E:
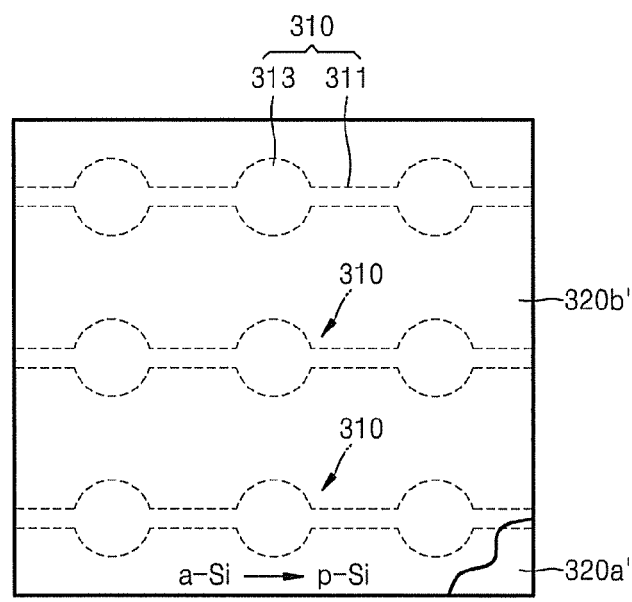

Referring to FIG. 8E, a p-type or an n-type amorphous silicon layer 320b' is disposed on the p-type or n-type amorphous silicon layer 320a', which is crystallized locally, using the CVD method.

Figure 8F:
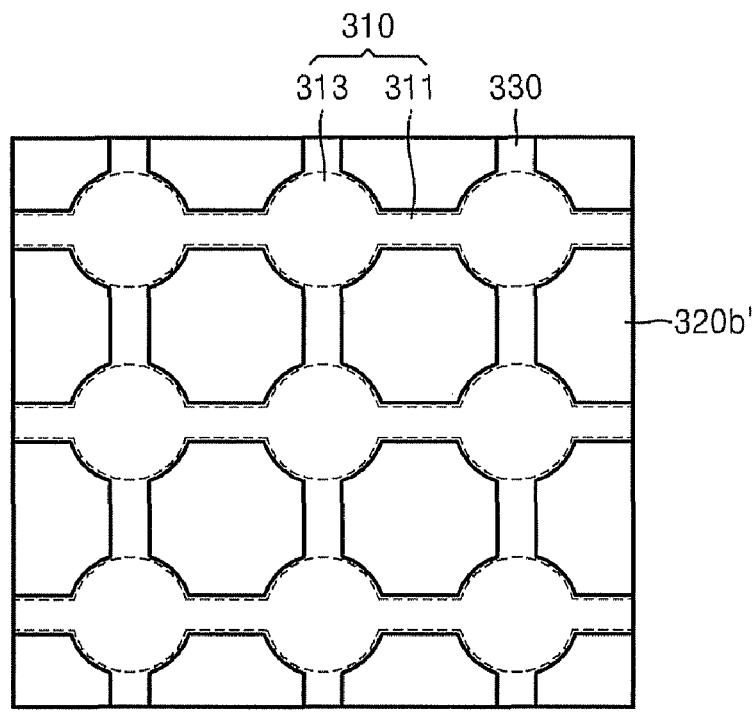

Referring to FIG. 8F, a transparent conductive layer such as the ITO layer is formed on the p-type or n-type silicon layer 320b', and is patterned to form second electrodes 330 in a grating-like configuration. The second electrodes can have a grating-like shape and are shown in FIGS. 5A and 5B.

Figure 8G:
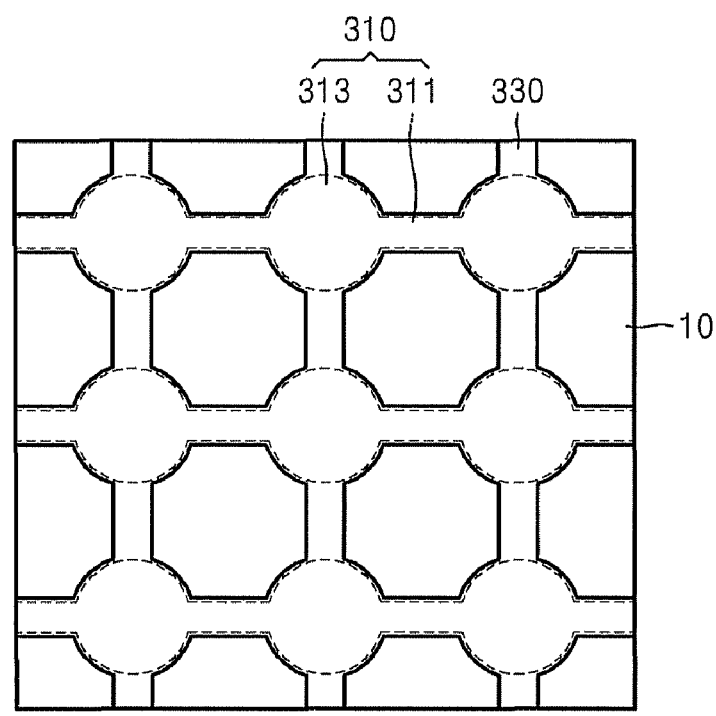

Referring to FIG. 8G, the structure under the second electrodes 330 is etched by a wet-etchant using the grating-shaped second electrodes 330 as a mask. At this time, the sacrificial layer 110' under the heating element 310 is also etched, and the sacrificial layer 110' under the support plates 313, having a relatively larger area than any other portions, are locally etched, for example, and may be undercut-etched. The sacrificial layer 110' is removed, except for the support pillars 110 under the support plates 313, by selecting the etching time appropriately. Here, a diameter of each of the support plates 313 and a width of each of the heating portions 311 can be selected when designing the solar cell in consideration of the degree of etching so that the sacrificial layer 110' remains only under the support plates 313. Through the above described processes, the solar cell array having a large area, as shown in FIGS. 5A through 5C, can be obtained.

While the disclosed embodiments has been particularly shown and described with reference to exemplary embodiments thereof, it will be understood by one of ordinary skill in the art that various changes in form and details may be made therein without departing from the spirit and scope of the disclosure as defined by the following claims.

What is claimed is:

1. A thin film solar cell comprising:
   a substrate;
   a first electrode for electrically generating heat, the first electrode comprises a plurality of heating portions;
   a support structure supporting the first electrode so that the first electrode is separated from the substrate, the support structure comprises $SiO_2$;
   a photoelectric conversion layer disposed on the first electrode, where the first electrode is in intimate contact with an entire surface of the photoelectric conversion layer;
   a second electrode disposed on the photoelectric conversion layer, and
   a plurality of support plates disposed on the support structure and extending away from the plurality of heating portions.

2. The thin film solar cell of claim 1, wherein the support structure comprises support pillars that support the plurality of support plates.

3. The thin film solar cell of claim 2, wherein the plurality of heating portions is arranged between the support plates.

4. The thin film solar cell of claim 1, wherein the plurality of heating portions has a first resistance, the plurality of support plates have a second resistance lower than the first resistance and wherein the support structure comprises support pillars which support the plurality of support plates.

5. A thin film solar cell comprising:
   a substrate;
   a first electrode for electrically generating heat, the first electrode comprises a heating portion extending in a first direction;
   a support structure supporting the first electrode so that the first electrode is separated from the substrate, the support structure comprises a support pillar and $SiO_2$;
   a photoelectric conversion layer disposed on the first electrode; where the first electrode is in intimate contact with an entire surface of the photoelectric conversion layer;
   a second electrode disposed on the photoelectric conversion layer;
   an extension extending from the heating portion in a second direction, which is different from the first direction; and
   a support plate disposed on an end portion of the extension, wherein the support pillar supports the support plate.

6. The thin film solar cell of claim 1, wherein the photoelectric conversion layer has a PN junction structure or a PIN junction structure.

7. The thin film solar cell of claim 6, wherein the photoelectric conversion layer comprises at least one of the PIN junction structure.

8. The thin film solar cell of claim 1, wherein the photoelectric conversion layer comprises at least one material selected from the group consisting of Si, Ge, a III-V compound, and a II-VI compound, and a combination comprising at least one of the foregoing materials.

9. The thin film solar cell of claim 1, wherein the photoelectric conversion layer is formed with a cross section having a band-like shape, a rod-like shape, a wire-like shape, or a thread shape.

* * * * *